United States Patent
Toprac

(10) Patent No.: US 6,560,506 B2
(45) Date of Patent: May 6, 2003

(54) METHOD AND APPARATUS FOR CONTROL FOR SEMICONDUCTOR PROCESSING FOR REDUCING EFFECTS OF ENVIRONMENTAL EFFECTS

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 197 days.

(21) Appl. No.: 09/729,412

(22) Filed: Dec. 4, 2000

(65) Prior Publication Data

US 2002/0069349 A1 Jun. 6, 2002

(51) Int. Cl.[7] .......................... G06F 19/00; H01L 21/00
(52) U.S. Cl. .......................... 700/121; 700/108; 438/5
(58) Field of Search .......................... 700/45, 71, 108, 700/121; 438/5, 7, 8

(56) References Cited

U.S. PATENT DOCUMENTS

| | | | | |
|---|---|---|---|---|
| 5,474,647 A | * | 12/1995 | Poultney et al. ................ 438/5 |
| 5,635,409 A | * | 6/1997 | Moslehi .................... 250/341.4 |
| 5,746,835 A | * | 5/1998 | Turner et al. ........ 118/723 MW |
| 5,935,302 A | * | 8/1999 | Ju et al. .......................... 96/4 |
| 5,939,130 A | * | 8/1999 | Shiraishi et al. .............. 118/52 |
| 6,051,349 A | * | 4/2000 | Yoshioka et al. ........... 118/111 |
| 6,061,605 A | * | 5/2000 | Davis ......................... 700/121 |
| 6,168,085 B1 | * | 1/2001 | Garcia ...................... 236/44 C |
| 6,427,096 B1 | * | 7/2002 | Lewis et al. ................ 700/228 |

* cited by examiner

Primary Examiner—Leo Picard
Assistant Examiner—Elliot Frank
(74) Attorney, Agent, or Firm—Williams, Morgan & Amerson, P.C.

(57) ABSTRACT

The present invention provides for a method and an apparatus for reducing the effects of manufacturing environmental factors. At least one process run of semiconductor devices is processed. A manufacturing environmental data analysis is performed upon the process run of semiconductor devices. A control parameter modification sequence is implemented in response to the manufacturing environmental data analysis.

29 Claims, 5 Drawing Sheets

METHOD AND APPARATUS FOR CONTROL FOR SEMICONDUCTOR PROCESSING FOR REDUCING EFFECTS OF ENVIRONMENTAL EFFECTS

BACKGROUND OF THE INVENTION

1. Field of the Invention

This invention relates generally to semiconductor products, and, more particularly, to a method and apparatus for controlling semiconductor manufacturing processes to reduce effects of environmental factors.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical polishing (CMP) control, etching, and overlay control. Overlay is one of several important steps in the photolithography area of semiconductor manufacturing. Overlay process involves measuring the misalignment between two successive patterned layers on the surface of a semiconductor device. Generally, minimization of misalignment errors is important to ensure that the multiple layers of the semiconductor devices are connected and functional.

Generally, process engineers currently analyze the process errors a few times a month. The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently the process tool updates are generally performed manually. Many times, errors in semiconductor manufacturing are not organized and reported to quality control personal. Often, the manufacturing models themselves incur bias errors that could compromise manufacturing quality.

Generally, a set of processing steps is performed on a lot of wafers on a semiconductor manufacturing tool called an exposure tool or a stepper, followed by processing of the semiconductor wafers in etch tools. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. There are many environmental factors that can affect the quality and efficiency of processed semiconductor wafers. These environmental factors include barometric pressure during process operation, certain gases present during process operation, temperature conditions, and relative humidity during process operation. Effects of the aforementioned environmental factors can damage semiconductor wafers during manufacturing processes. One major effect of environmental factors in semiconductor manufacturing processes is the errors that occur in the critical dimensions of the processed semiconductor wafer. Errors in the critical dimensions of a semiconductor wafers can cause severe performance problems.

The present invention is directed to overcoming, or at least reducing the effects of, one or more of the problems set forth above.

SUMMARY OF THE INVENTION

In one aspect of the present invention, a method is provided for reducing the effects of manufacturing environmental factors. At least one process run of semiconductor devices is processed. A manufacturing environmental data analysis is performed upon the process run of semiconductor devices. A control parameter modification sequence is implemented in response to the manufacturing environmental data analysis.

In another aspect of the present invention, an apparatus is provided for reducing the effects of manufacturing environmental factors. The apparatus of the present invention comprises: a computer system; a manufacturing model coupled with the computer system, the manufacturing model being capable of generating at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; a metrology data processing unit coupled with the metrology tool and the computer system, the metrology data processing unit being capable of organizing the acquired metrology data and sending the organized metrology data to the computer system; an environmental sensor coupled to the processing tool, the environmental sensor being capable of acquiring environmental data during an operation of the processing tool; and an environmental data analysis unit coupled with the environmental sensor, the environmental data analysis unit being capable of organizing the environmental data and correlating the environmental data with the metrology data.

BRIEF DESCRIPTION OF THE DRAWINGS

The invention may be understood by reference to the following description taken in conjunction with the accompanying drawings, in which like reference numerals identify like elements, and in which.

Figure 1:
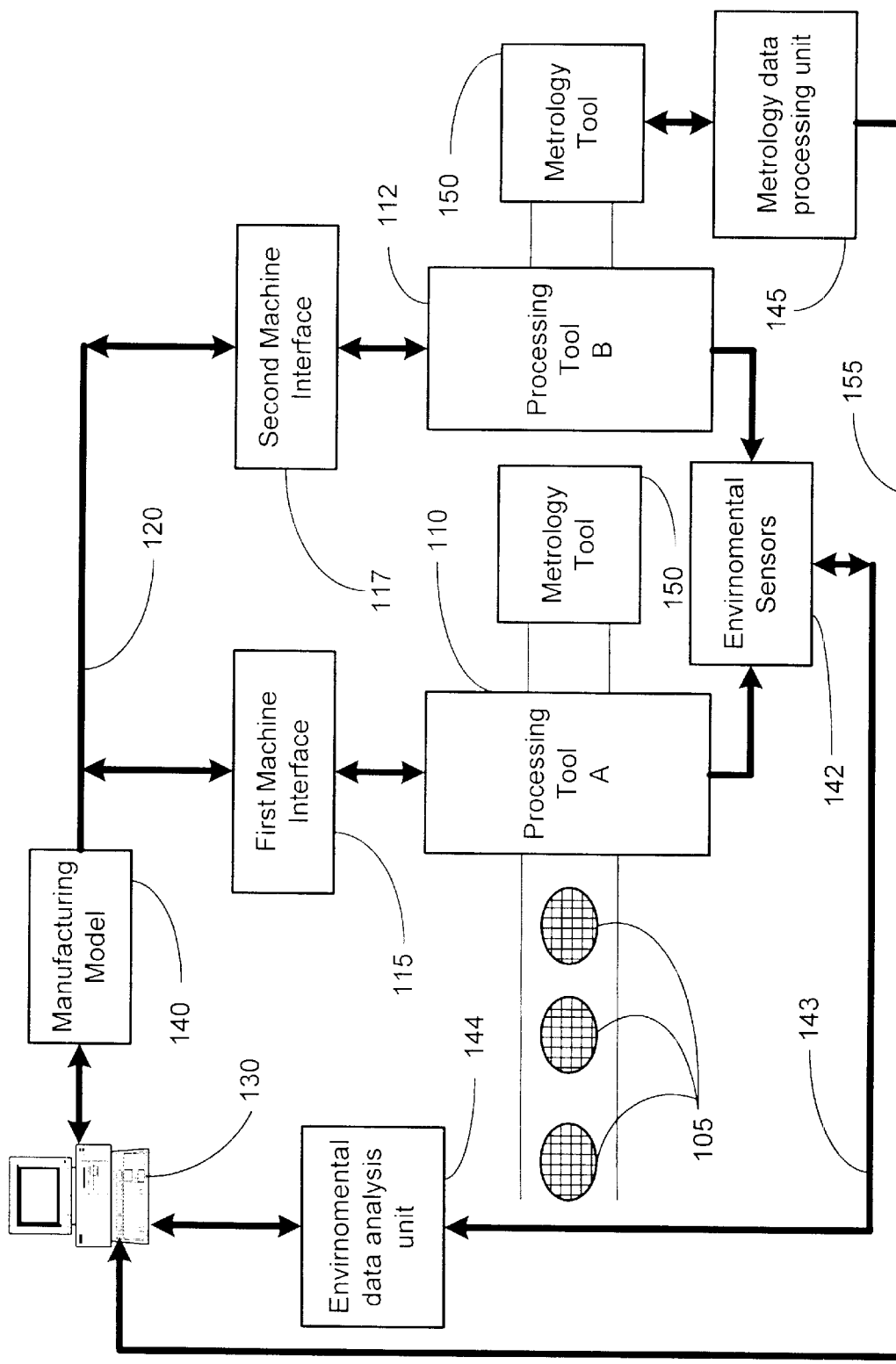
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Overlay and etching processes are important groups of process steps in semiconductor manufacturing. In particular, metrology data, including manufacturing data, is acquired after manufacturing processes such as photolithography and photoresist etching processes are substantially completed. The metrology data can be used to make adjustments to manufacturing processes for subsequent manufacturing runs of semiconductor devices, such as semiconductor wafers. Environmental factors can affect the quality and performance of the semiconductor wafers. Environmental factors include barometric pressure during process operation, certain gases present during process operation, temperature conditions, and relative humidity during process operation. The present invention provides a method and an apparatus for implementing a feedback system to reduce the effects of environmental factors during the manufacturing of semiconductor devices.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model contains a recipe that determines a plurality of control input parameters that are sent on the line 120.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers, scanners, step-and-scan tools, and etch process tools. In one embodiment, processing tool A 110 and processing tool B 112 are photolithography process tools, such as steppers.

The system illustrated in FIG. 1 includes environmental sensors 142 that acquire environmental data from processing tool A 110 and processing tool B 112. The environmental data that is collected includes barometric pressure during process operation, readings of certain gases present during process operation, ambient temperature conditions, and the relative humidity during process operation. Environmental data from the environmental sensors 142 is sent to the environmental data analysis unit 144 via a line 143. The environmental data analysis unit 144 organizes and correlates the environmental data from the environmental sensors 142 and sends the environmental data to the computer system 130, where it is stored. In one embodiment, the environmental data analysis unit 144 is a software program that is integrated into the computer system 130.

Figure 2:
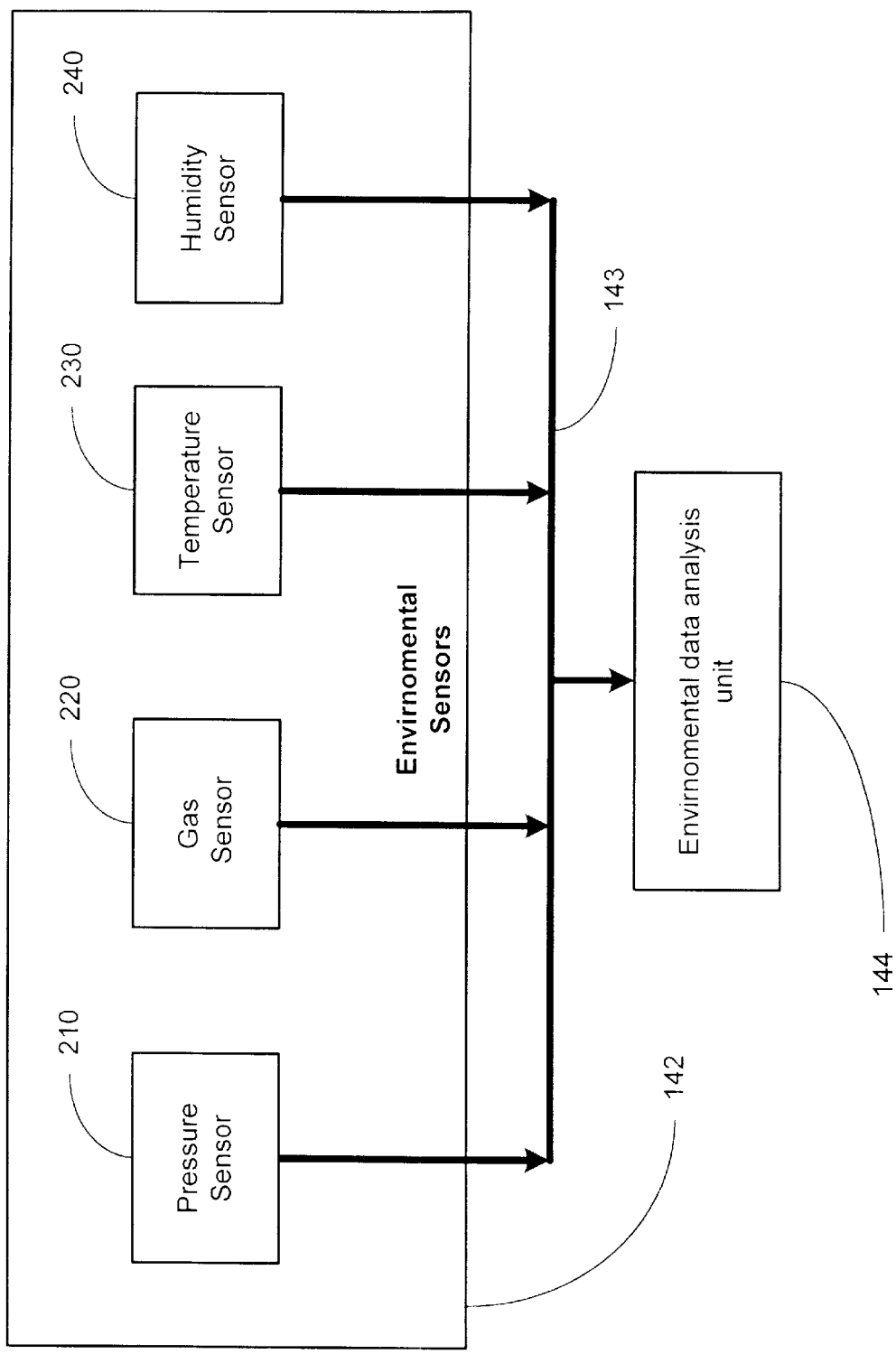
FIG. 2 illustrates a more detailed depiction of the environmental sensors described in FIG. 1.

Turning now to FIG. 2, one embodiment of the environmental sensors 142 is illustrated. The environmental sensors 142 comprise at least one pressure sensor 210, at least one gas sensor 220, at least one temperature sensor 230, and at least one humidity sensor 240. As illustrated in FIG. 2, data from the individual sensors 210–240 is sent to the environmental data analysis unit 144 on the line 143. The pressure sensor 210 detects the barometric pressure during the operation of the processing tools 110, 112 and sends the pressure data to the environmental data analysis unit 144. The temperature and humidity sensors 230, 240 detect the ambient temperature and the relative humidity, respectively, during the operation of the processing tool 110, 112. The gas sensor 220 is capable of detecting nitrogen bearing species, such as ammonium, and other process-related gases, during the operation of the processing tools 110, 112. The presence of nitrogen bearing gases can cause non-uniform patterning of photoresist material on the semiconductor wafer, causing the deterioration of the geometry of post-etch pattern features. The environmental data analysis unit 144 collects and organizes the data, such as the amount of nitrogen bearing species present, from the environmental sensors 142 and sends it to the computer system 130.

Turning back to FIG. 1, for processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. For processing tools such as etch process tools, the control inputs on the line 120 include an etch time-period control signal, an etch temperature control signal, and an etch pressure control signal.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

Figure 3:
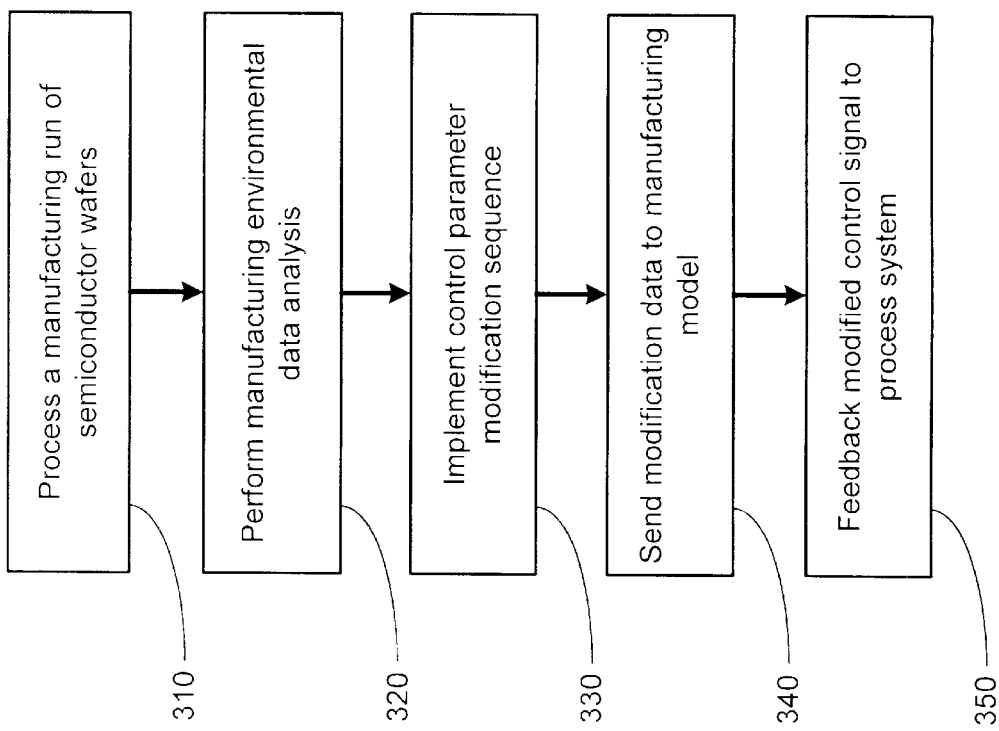
FIG. 3 illustrates a flowchart representation of one method of performing feedback control of semiconductor manufacturing processes to reduce the effects of environmental factors.

Turning now to FIG. 3, a flowchart representation of one method of performing feedback control of semiconductor manufacturing processes to reduce the effects of environmental factors is illustrated. In one embodiment, a manufacturing run of semiconductor wafers is processed, as described in block 310 of FIG. 3. The manufacturing processes performed upon the semiconductor wafers may include photolithography processes, chemical-etch processes, chemical-mechanical polishing processes, and the like. A manufacturing environmental data analysis step is performed on the processed semiconductor wafers, as described in block 320 of FIG. 3. A more detailed description of the step of performing manufacturing environmental data analysis is illustrated in FIG. 4.

Figure 4:
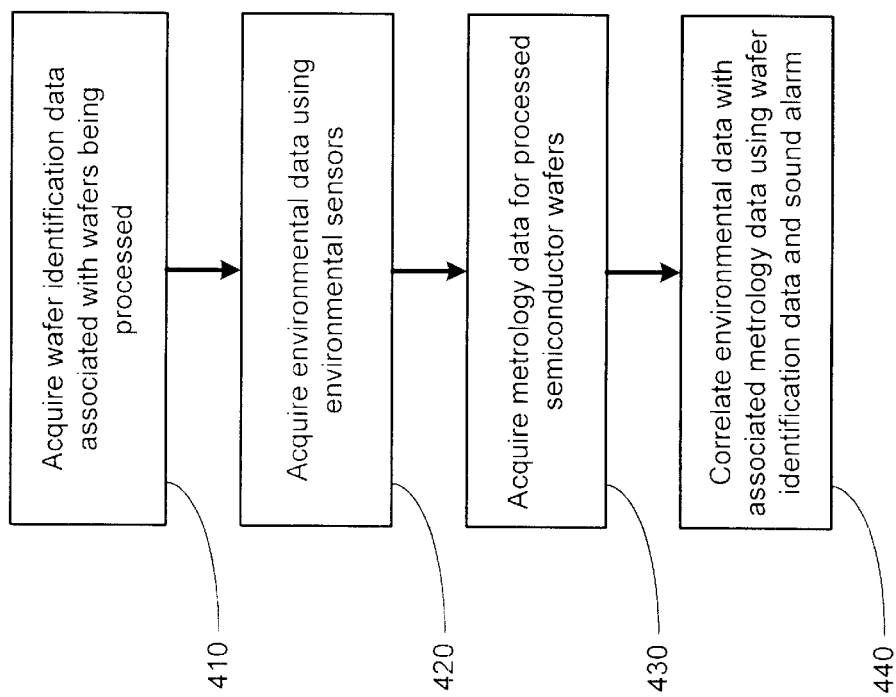
FIG. 4 illustrates a more detailed depiction of one embodiment of the step of performing environmental data analysis described in FIG. 3.

Turning now to FIG. 4, wafer identification data associated with the processed semiconductor wafers is acquired, as described in block 410. The wafer identification data that is acquired includes semiconductor wafer set number, date coding, manufacturing coding, and the like. In one embodiment, the wafer identification data is stored in the computer system 130. Environmental data associated with the processed semiconductor wafers is acquired using the environmental sensors 142, as described in block 420 of FIG. 4. The environmental data that is acquired may include the barometric pressure during process operation, certain gases present during process operation, temperature conditions, and relative humidity during process operation. The environmental data is collected and organized by the environmental data analysis unit 144. In one embodiment, the environmental data is then stored in memory (not shown) associated with the computer system 130.

Once the semiconductor wafers are at least partially processed, metrology data relating to the processed semiconductor wafers is acquired, as described in block 430 of FIG. 4. The processed semiconductor wafers are sent to the metrology tool 150, which performs metrology data acquisition upon the processed semiconductor wafers. The metrology data that is acquired may include critical dimension data, photolithography misregistration data, and the like. Once the metrology data is acquired, the metrology data processing unit 145 collects and organizes the metrology data. In one embodiment, the metrology data processing unit 145 is a software program that is integrated into the computer system 130. The acquired metrology data is stored in memory associated with the computer system 130.

In one embodiment, the environmental data is correlated with the corresponding metrology data, as described in block 440 of FIG. 4. In one embodiment, the wafer identification data is used perform the correlation between the environmental data and the corresponding metrology data. The quality of the processed semiconductor wafers is examined by analyzing the metrology data. Certain characteristics, such as abnormal critical dimension measurements, can then be correlated to particular characteristics of the environmental data. Using this correlation, a corrective feedback algorithm can be developed by those skilled in the art to compensate for the effects of certain manufacturing environmental factors.

The correlation analysis described above can be used to modify control input parameters on the line 120 to compensate for manufacturing environmental factors during subsequent manufacturing processes. Turning back to FIG. 3, once the step of performing environmental data analysis is substantially complete, a control parameter modification sequence is implemented, as described in block 330. One embodiment of performing control parameter modification sequence is illustrated in FIG. 5.

Figure 5:
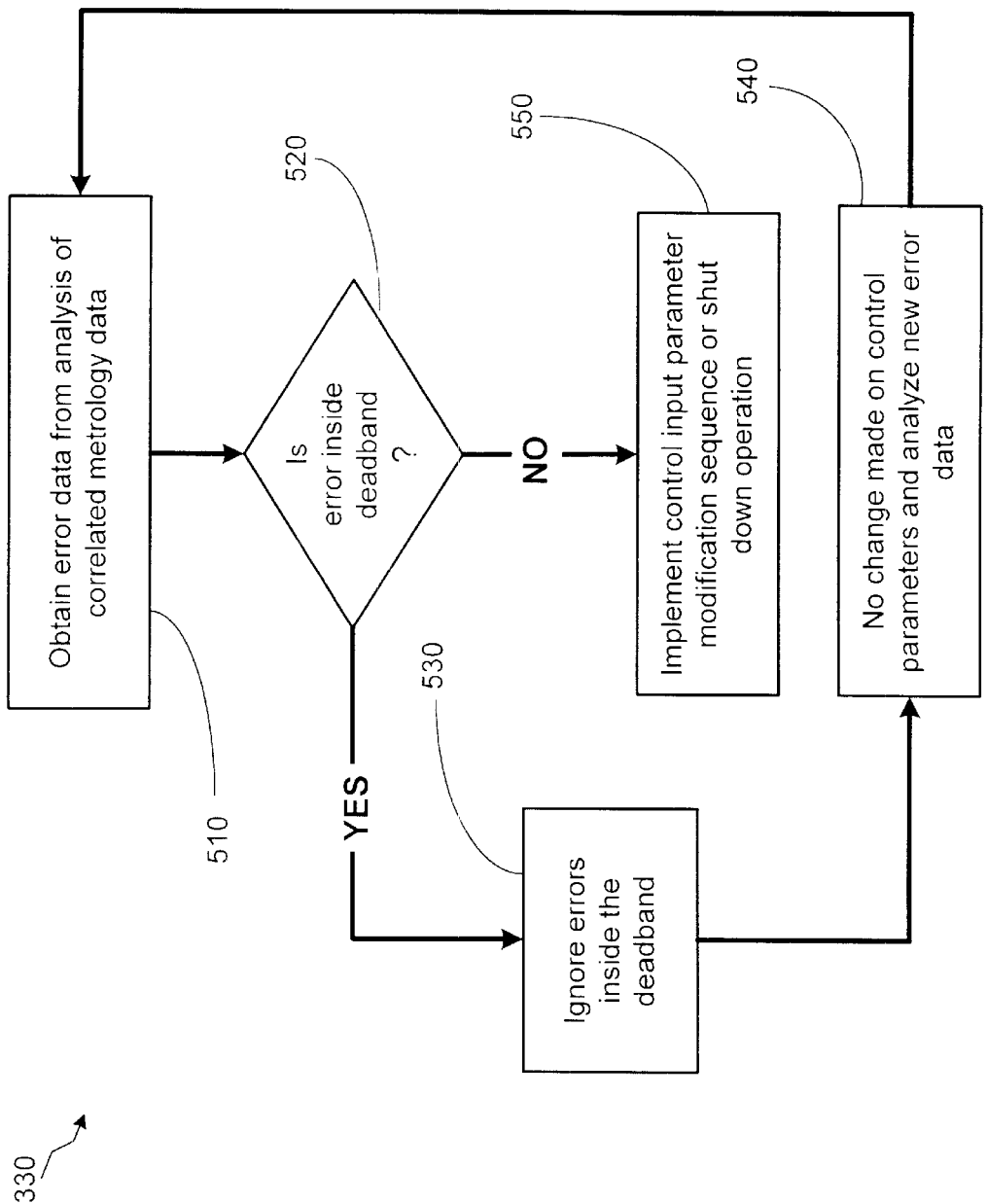
FIG. 5 illustrates a flowchart representation of a more detailed depiction of the step of performing modification of control input parameters described in FIG. 4.

Turning now to FIG. 5, error data from the analysis of results from the correlation of environmental data and the corresponding metrology data is acquired, as described in block 510. Once the error data is acquired, a determination is made whether the error data is inside the deadband, as described in block 520 of FIG. 5. The step described in block 520 is performed to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 520, that an error corresponding to a control input signal is inside the deadband, that particular error is ignored, as described in block 530 of FIG. 5. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data, as described in block 540 of FIG. 5. New error data is then obtained and analyzed, as described in block 540 of FIG. 5. In one embodiment, the steps described above are repeated for the new error data that is obtained.

When a determination is made, as shown in block 520, that an error corresponding to a control input signal is not inside the deadband, further processing, such as implementing a control input parameter modification sequence, is performed, as described in block 550 of FIG. 5. The value of the error corresponding to a control input signal is used to update that control input parameter on the line 120 for a subsequent manufacturing process step, which completes the step of performing modification of process control parameters, described in block 330 of FIG. 3.

The modification data, which is generated by the control input modification sequence described in block 330, is sent to the manufacturing model 140, as described in block 340 of FIG. 3. In one embodiment, the computer system 130 sends the modification data to the manufacturing model 140 for further processing. The manufacturing model 140 utilizes the modification data to modify its process recipe and generate new control input parameters. The manufacturing model 140 then sends the modified control input parameter signals to the machine interfaces 115, 117 for further processing, as described in block 350 of FIG. 3. The feedback loop that is created by acquiring environmental and metrology data and modifying control input parameters in response to the analysis of the environmental and metrology data works to reduce the effect of environmental factors during the manufacturing of semiconductor wafers.

The principles taught by the present invention can be implemented in an Advanced Process Control (APC) Framework software system. The APC Framework software is a preferred platform from which to implement the overlay control and etch process control strategy taught by the present invention. In some embodiments, the APC Framework software can be a factory-wide software system, therefore, the control strategies taught by the present invention can be applied to virtually any of the semiconductor manufacturing tools on the factory floor. The APC Framework software also allows for remote access and monitoring of the process performance. Furthermore, by utilizing the APC Framework software, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC Framework could require a number of software components. In addition to components within the APC framework software, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller and etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing at least one process run of semiconductor devices;
    performing a manufacturing environmental data analysis upon said process run of semiconductor devices using identification data associated with said semiconductor devices; and
    implementing a control parameter modification sequence in response to said manufacturing environmental data analysis.

2. The method described in claim 1, wherein performing a process run of semiconductor devices further comprises processing semiconductor wafers.

3. The method described in claim 2, wherein processing semiconductor wafers further comprises performing a photolithography process on said semiconductor wafers.

4. The method described in claim 1, wherein performing a manufacturing environmental data analysis further comprises:
    acquiring identification data associated with said processed semiconductor devices;
    acquiring environmental data associated with said processed semiconductor devices;
    acquiring metrology data associated with said processed semiconductor devices; and
    correlating said environmental data with said metrology data using said identification data.

5. The method described in claim 4, wherein acquiring identification data further comprises acquiring at least one of:
    a date code;
    a manufacturing code; and
    a wafer set number.

6. The method described in claim 4, wherein acquiring environmental data further comprises acquiring at least one of:
    a barometric pressure reading during a semiconductor manufacturing operation;
    a nitrogen bearing gas species reading;
    an ambient temperature reading; and
    a relative humidity reading.

7. The method described in claim 4, wherein acquiring metrology data further comprises acquiring at least one critical dimension measurement.

8. The method described in claim 1, wherein implementing a control parameter modification sequence further comprises:
    acquiring error data from said analysis of correlation of metrology data and said environmental data;
    determining if said error data is inside a deadband; and
    modifying at least one control input parameter based upon a determination that said error data is not inside said deadband.

9. An apparatus, comprising:
    means for performing at least one process run of semiconductor devices;

means for performing a manufacturing environmental data analysis upon said process run of semiconductor devices using identification data associated with said semiconductor devices; and means for implementing a control parameter modification sequence in response to said manufacturing environmental data analysis.

10. A computer readable program storage device encoded with instructions that, when executed by a computer, performs a method, comprising:

performing at least one process run of semiconductor devices;

performing a manufacturing environmental data analysis upon said process run of semiconductor devices using identification data associated with said semiconductor devices; and implementing a control parameter modification sequence in response to said manufacturing environmental data analysis.

11. The computer readable program storage device encoded with instructions that, when executed by a computer, performs the method described in claim 10, wherein performing a process run of semiconductor devices further comprises processing semiconductor wafers.

12. The computer readable program storage device encoded with instructions that, when executed by a computer, performs the method described in claim 11, wherein processing semiconductor wafers further comprises performing a photolithography process on said semiconductor wafers.

13. The computer readable program storage device encoded with instructions that, when executed by a computer, performs the method described in claim 10, wherein performing a manufacturing environmental data analysis further comprises:

acquiring identification data associated with said processed semiconductor devices;

acquiring environmental data associated with said processed semiconductor devices;

acquiring metrology data associated with said processed semiconductor devices; and correlating said environmental data with said metrology data using said identification data.

14. The computer readable program storage device encoded with instructions that, when executed by a computer, performs the method described in claim 13, wherein acquiring identification data further comprises acquiring at least one of:

a date code;

a manufacturing code; and a wafer set number.

15. The computer readable program storage device encoded with instructions that, when executed by a computer, performs the method described in claim 13, wherein acquiring environmental data further comprises acquiring at least one of:

a barometric pressure reading during a semiconductor manufacturing operation;

a nitrogen bearing gas species reading;

an ambient temperature reading; and a relative humidity reading.

16. The computer readable program storage device encoded with instructions that, when executed by a computer, performs the method described in claim 13, wherein acquiring metrology data further comprises acquiring at least one critical dimension measurement.

17. The computer readable program storage device encoded with instructions that, when executed by a computer, performs the method described in claim 10, wherein implementing a control parameter modification sequence further comprises:

acquiring error data from said analysis of correlation of metrology data and said environmental data;

determining if said error data is inside a deadband; and modifying at least one control input parameter based upon a determination that said error data is not inside said deadband.

18. A system, comprising:

at least one processing tool for performing at least one process run of semiconductor devices; and a controller for performing a manufacturing environmental data analysis upon said process run of semiconductor devices using identification data associated with said semiconductor devices, and for implementing a control parameter modification sequence in response to said manufacturing environmental data analysis.

19. The system of claim 18, wherein performing a process run of semiconductor devices further comprises processing semiconductor wafers.

20. The system of claim 19, wherein processing semiconductor wafers further comprises performing a photolithography process on said semiconductor wafers.

21. The system of claim 18, wherein the controller acquires identification data associated with said processed semiconductor devices, acquires environmental data associated with said processed semiconductor devices, acquires metrology data associated with said processed semiconductor devices, and correlates said environmental data with said metrology data using said identification data.

22. The system of claim 21, wherein the identification data comprises acquiring at least one of:

a date code;

a manufacturing code; and a wafer set number.

23. The system of claim 21, wherein the environmental data further comprises at least one of:

a barometric pressure reading during a semiconductor manufacturing operation;

a nitrogen bearing gas species reading; an ambient temperature reading; and a relative humidity reading.

24. The system of claim 21, wherein acquiring metrology data further comprises acquiring at least one critical dimension measurement.

25. The system of claim 21, wherein the controller acquires error data from said correlation of metrology data and said environmental data, determines if said error data is inside a deadband, and modifies at least one control input parameter based upon a determination that said error data is not inside said deadband.

26. An apparatus, comprising:

a controller for performing a manufacturing environmental data analysis relating to processing semiconductor devices using identification data associated with said semiconductor devices, and for modifying at least one control input parameter based upon said manufacturing environmental data analysis.

27. The apparatus of claim 26, wherein the controller acquires identification data associated with said processed semiconductor devices, acquires environmental data associated with said processed semiconductor devices, acquires metrology data associated with said processed semiconductor devices, and correlates said environmental data with said metrology data using said identification data.

28. The apparatus of claim 26, wherein the identification data comprises acquiring at least one of:

a date code;

a manufacturing code; and a wafer set number.

29. The apparatus of claim 27, wherein the environmental data further comprises at least one of:

a barometric pressure reading during a semiconductor manufacturing operation;

a nitrogen bearing gas species reading;

an ambient temperature reading; and a relative humidity reading.

* * * * *